United States Patent [19]
Ishizuka et al.

[11] Patent Number: 5,126,562
[45] Date of Patent: Jun. 30, 1992

[54] ENCODER FOR SETTING OPTICAL PATH LENGTHS OF RELATED BEAMS

[75] Inventors: Koh Ishizuka, Urawa; Tetsuharu Nishimura, Kawasaki, both of Japan

[73] Assignee: Canon Kabushiki Kaisha, Tokyo, Japan

[21] Appl. No.: 605,437

[22] Filed: Oct. 30, 1990

[30] Foreign Application Priority Data

Oct. 31, 1989 [JP] Japan ................. 1-285896

[51] Int. Cl.⁵ ................. G01B 9/02; G01D 5/34
[52] U.S. Cl. ................. 250/231.14; 250/237 G; 356/356
[58] Field of Search ............ 250/231.16, 231.14, 250/237 G; 356/356, 358, 373–374; 33/707

[56] References Cited

U.S. PATENT DOCUMENTS

| | | | |
|---|---|---|---|
| 4,676,645 | 6/1987 | Taniguchi et al. | 356/356 |
| 4,829,342 | 5/1989 | Nishimura | 356/356 |
| 4,868,385 | 9/1989 | Nishiumura | 250/231 |
| 4,912,320 | 3/1990 | Ishii et al. | 250/231.13 |
| 4,930,895 | 6/1990 | Nishimura et al. | 356/356 |
| 4,967,072 | 10/1990 | Nishimura | 250/231.16 |
| 4,970,388 | 11/1990 | Nishimura et al. | 250/237 G |
| 4,975,570 | 12/1990 | Nishimura et al. | 250/231.16 |
| 4,979,826 | 12/1990 | Ishizuka et al. | 356/356 |
| 5,000,542 | 3/1991 | Nishimura et al. | 350/115 |

*Primary Examiner*—David C. Nelms
*Assistant Examiner*—Michael Messinger
*Attorney, Agent, or Firm*—Fitzpatrick, Cella, Harper & Scinto

[57] ABSTRACT

An encoder includes a first polarizing beam splitter for splitting a beam into first and second beams, and a first λ/4 plate arranged in respective first and second optical paths. A first optical device causes the beams to be incident on a diffraction grating so that positive first and negative second mode diffracted beams travel along the first and second optical paths, respectively, and superposes the diffracted beams on each other. A second polarizing beam splitter splits the diffracted beams from each other, and a second λ/4 plate is arranged in third and fourth optical paths for the diffracted beams, respectively. A second optical device causes the diffracted beams to be incident on the diffraction grating so that positive and negative first mode rediffracted beams travel along the third and fourth optical paths, respectively, and superposes the rediffracted beams on each other. A converting device causes the rediffracted beams to interfere with each other to form an interfered beam, which is converted into an electrical signal. A difference between optical path lengths of beams incident on the converting device through the first and fourth paths and through the second and fourth paths, and a difference between optical path lengths of beams incident on the converting device through the first and third paths and through the second and third paths are larger than a coherent length of the light source beam.

11 Claims, 6 Drawing Sheets

ENCODER FOR SETTING OPTICAL PATH LENGTHS OF RELATED BEAMS

BACKGROUND OF THE INVENTION

1. Field of the Invention

The present invention relates to an encoder and, more particularly, to an encoder for detecting a relative displacement between a diffraction grating and a light beam incident on the diffraction grating by causing several diffracted components emerging from the diffraction grating to interfere with each other and photoelectrically converting an interfered beam.

2. Related Background Art

A conventional encoder is used in an NC machine tool or the like as a sensor for detecting the position or an angular displacement of a workpiece. In recent years, a higher resolution and higher precision are increasingly required for such an encoder.

In a known conventional high-precision encoder having a high resolution, a diffraction grating is used as a displacement detection optical scale, a recording density of the diffraction grating is set to be several microns per pitch, and several diffraction light components emerging from the diffraction grating are interfered with each other to obtain a period signal corresponding to a displacement of the scale. When the recording density of the diffraction grating is, however increased to increase the resolution and improve the precision, e.g., to an order of the light wavelength, a diffraction angle (i.e., an angle of a beam emerging from the diffraction grating) of the diffracted beam is increased, and the layout of optical members becomes cumbersome.

Figure 7:
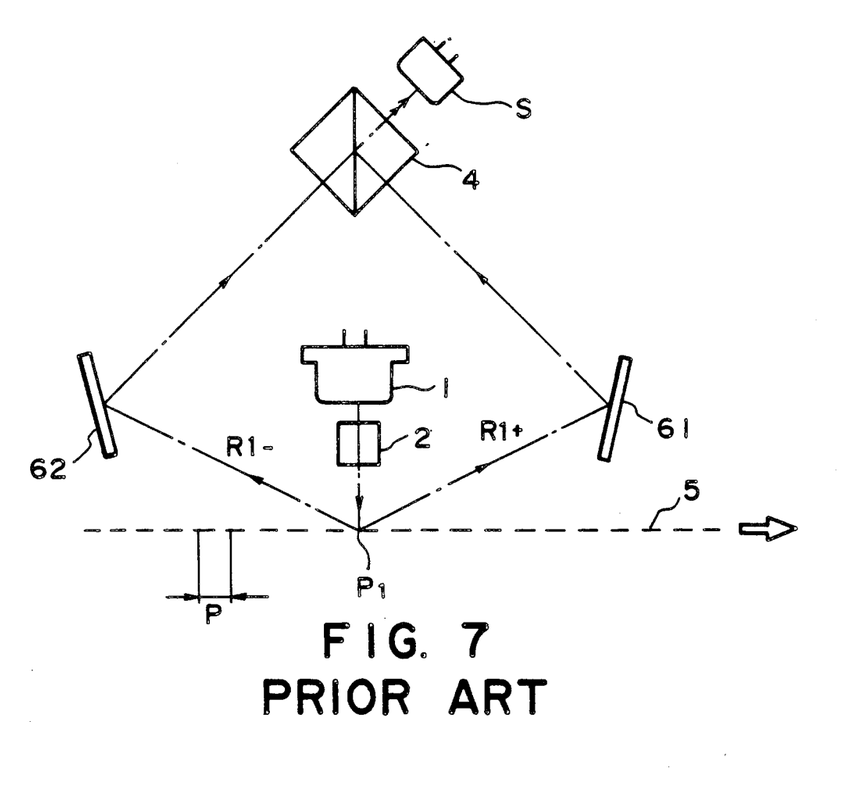
FIG. 7 is a schematic view showing a conventional encoder.

In a conventional encoder shown in FIG. 7, a signal corresponding to a displacement of a scale is generated by the following operations.

A light beam from a laser diode 1 is collimated by a collimator lens 2 and is vertically incident on a point P1 on a diffraction grating 5. A first mode diffracted beam (R1+) emerging from the point P1 is returned to a beam splitter 4 through a mirror 61. At the same time, a first mode diffracted beam (R1−) emerging from the point P1 is returned to the beam splitter 4 through a mirror 62. These first mode diffracted beams are interfered with each other through the beam splitter 4. The phase of the wave front of the positive first mode diffracted beam is advanced by $2\pi$ and the phase of the wave front of the negative first mode diffracted beam is delayed by $2\pi$ while the diffraction grating 5 is moved by one pitch. On the basis of this principle, the two beams are interfered with each other to obtain an interfered beam. An intensity change having two periods upon movement of one pitch of the grating can be obtained by this interfered beam. That is, a period signal having a period twice the number of grating lines of the diffraction grating 5 can be extracted.

As described above, however, when the recording density of the diffraction grating 5 is increased (pitch is decreased), the diffraction angle of the diffracted beam is increased. The exit angle of the diffracted beam from the diffraction grating 5 is close to 90°. The mirrors 61 and 62 must be located near the diffraction grating 5 so as not to be brought into contact with the diffraction grating 5. This layout is very cumbersome. In addition, when the grating pitch of the diffraction grating 5 is smaller than the wavelength of the beam from the laser diode 1, diffracted components cannot be extracted from the diffraction gratings. In this case, it is impossible to detect even a change in diffraction grating 5.

The present assignee disclosed a rotary encoder (copending application U.S. Ser. No. 522,051) which could solve the above problem and could easily extract diffracted components even if the pitch of the diffraction grating is decreased.

SUMMARY OF THE INVENTION

It is an object of the present invention to provide an encoder which is capable of performing detection with higher precision by stabilizing the amplitude and phase of a signal obtained by photoelectrically converting an interfered beam.

BRIEF DESCRIPTION OF THE DRAWINGS

FIGS. 4(A), (B), (C), (D), and (E) are views for explaining modes of diffracted beams;

DETAILED DESCRIPTION OF THE PREFERRED EMBODIMENT

A rotary encoder disclosed in copending application U.S. Ser. No. 522,051 will be described to clarify the object of the present invention prior to a description of a preferred embodiment of the present invention.

Figure 1:
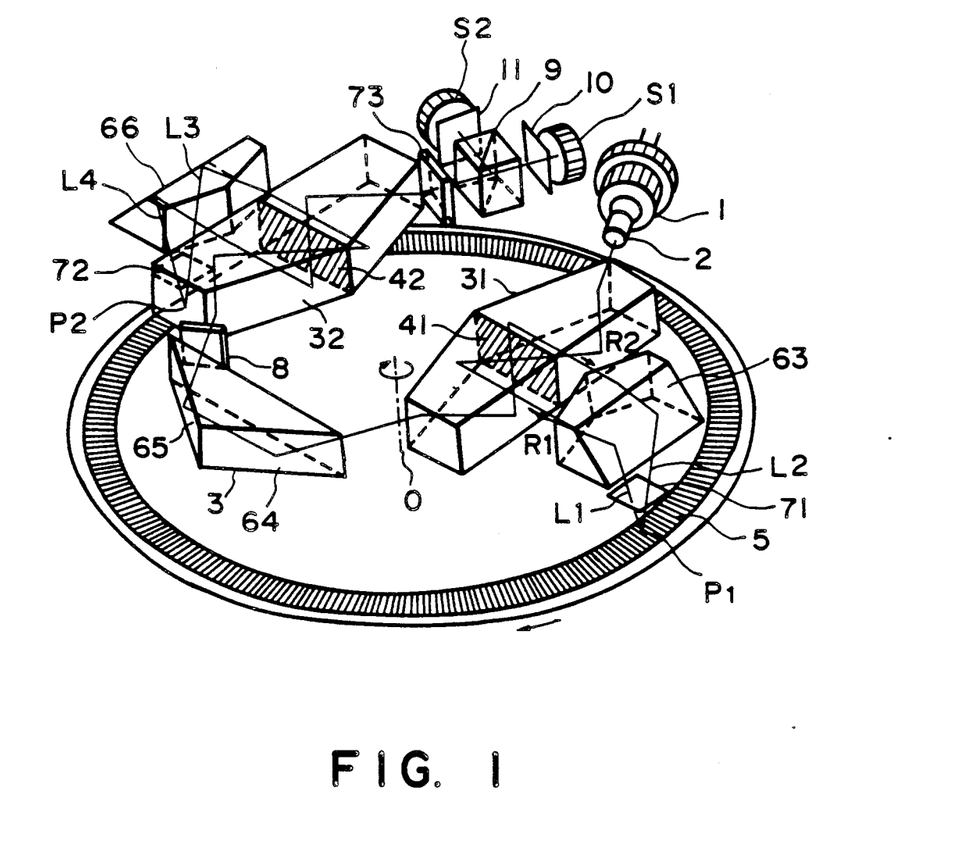
FIG. 1 is a perspective view of a rotary encoder.

FIG. 1 is a perspective view showing the rotary encoder of this prior art.

Referring to FIG. 1, the rotary encoder comprises a light source 1 comprising a laser diode, a collimator lens 2, prisms 31 and 32, polarizing beam splitter surfaces 41 and 42 in the prisms 31 and 32, a rotary disk (diffraction grating) 5, mirrors 63, 64, 65, and 66, $\lambda/4$ plates 71, 72, and 73, a $\lambda/2$ plate 8, a nonpolarizing beam splitter 9, and polarizing elements (e.g., polarizing plates or polarizing prisms) 10 and 11. The rotary encoder also comprises light-receiving elements S1 and S2.

A laser beam having a wavelength $\lambda$ emitted from the light source 1 is collimated by the collimator lens 2. This collimated beam is incident on the prism 31 to be split into light beams R1 and R2 traveling along symmetrical optical paths L1 and L2 by the mirror surface or polarizing beam splitter surface 41 formed at a predetermined position of the prism 31. The light beams R1 and R2 are reflected by the mirror 63 and pass through the $\lambda/4$ plate 71. The resultant beams are simultaneously incident on the first point (P1) of a radial diffraction grating having a grating pitch P and formed in the rotary disk 5. In this case, incident angle $\theta_0$, i.e., $\theta_0 = \sin^{-1}(\lambda/2P)$ of the beams R1 and R2 is determined so that, of a plurality of diffracted beams diffracted by the diffraction grating and emerging from the point P1, the positive first mode diffracted beam of the beam R1 and the negative first mode diffracted beam of the light beam R2 return along the optical paths L1 and L2, respectively. Although the light beams R1 and R2 are linearly polarized beams whose polarizing planes are perpendicular to each other when the beams R1 and R2 are split by the polarizing beam splitter surface 41, the polarizing planes of the beams R1 and R2 are reversed upon reciprocal propagation through the λ/4 plate 71. Since the beam R1 is a linearly polarized beam (P-polarized beam) having passed through the polarizing beam splitter surface 41, the positive first mode diffracted beam (R1+) of the beam R1 is polarized into an S-polarized beam through the λ/4 plate 71. The S-polarized beam is reflected by the polarizing beam splitter surface 41 and emerges from the prism 31. Since the beam R2 is a linearly polarized beam (S-polarized beam) reflected by the polarizing beam splitter surface, the negative first mode diffracted beam (R2−) reflected by the polarizing beam splitter surface becomes a P-polarized beam through the λ/4 plate 71. This beam passes through the polarizing beam splitter surface 41 and is superposed on the beam (R1+), so that the superposed beams emerge from the prism 31. The superposed beams of the positive first mode diffracted beam (R1+) of the beam R1 and the negative first mode diffracted beam (R2−) of the beam R2 are transmitted through the mirrors 64 and 65 of the prism 3. The superposed beams pass through the λ/2 plate 8 and are incident on the prism 32. By using the mirror surface or polarizing beam splitter surface 42 located at the predetermined position of the prism 32, the beam (R1+) travels along an optical path L3, and the beam (R2−) travels along an optical path L4. These beams are reflected by the mirror 66 and pass through the λ/4 plate 72. The beams are incident on the second point (P2) of the radial diffraction grating of the rotary disk 5 at the incident angle $\theta_0$. The λ/2 plate 8 converts the polarizing plane of the positive first mode diffracted beam (R1+) from the S-polarized beam to the P-polarized beam, and the polarizing plane of the negative first mode diffracted beam (R2−) from the P-polarized beam to the S-polarized beam. The points P1 and P2 are located at positions symmetrical about the rotational axis 0 of the disk 5. Of a plurality of beams reflected and diffracted by the diffraction grating and emerging from the point P2, a positive first mode rediffracted beam (R1++) of the beam (R1+) travels back along the optical path L3, passes through the λ/4 plate 72 to be an S-polarized beam, and is then reflected by the polarizing beam splitter surface 42 of the prism 32. The reflected beam then emerges from the prism 32. On the other hand, a negative first mode rediffracted beam (R2−−) of the beam (R2−) travels back along the optical path L4, passes through the λ/4 plate 72 to be a P-polarized beam, and passes through the polarizing beam splitter surface 42 of the prism 32. The transmitted beam is superposed on the positive first mode rediffracted beam (R1++) and emerges from the prism 32. The superposed beams pass through the λ/4 plate 73 and become two beams whose polarizing planes are circularly polarized in opposite directions. A polarizing state of the composite beam of the two circularly polarized beams is given as a linearly polarized beam. The polarization direction of this linearly polarized beam is determined by a phase difference between the wave fronts of the positive first mode rediffracted beam (R1++) and the negative first mode rediffracted beam (R1−−) which are changed upon rotation of the rotary disk 5. When the phase difference is changed in an order of 0, $\pi/4$, $2\pi/4$, $3\pi/4$, $4\pi/4$, $5\pi/4$, ... and $8\pi/4$, then the polarization direction of the linearly polarized beam is rotated in an order of 45°, 67.5°, 90°, 112.5°, 135°, 157.5°, ... and 225° (45°). This linearly polarized beam is split into two beams having equal light amounts by the nonpolarizing beam splitter 9. Only a specific polarized component of one split beam is extracted by the polarizing element 10 and is incident on the light-receiving element S1 as an interfered beam. Only a specific polarized component of the other split beam is extracted by the polarizing element 11 and is incident on the light-receiving element S2 as an interfered beam. Period signals corresponding to a rotational amount of the rotary disk 5 are output from the light-receiving elements S1 and S2. When the polarized components extracted by the polarizing elements 10 and 11 have a phase difference of 45°, the fringe pattern of the interfered beams incident on the light-receiving elements S1 and S2 is shifted by ⅛ period (i.e., $\pi/2$ as a phase difference between the output signals). As in the first embodiment shown in FIG. 1, two period signals having a phase difference of 90° are electrically amplified or binarized, thereby detecting the rotational angle or direction of the rotary disk 5.

In this rotary encoder, even if a pitch of the radial diffraction grating of the rotary disk 5 becomes equal to the wavelength λ of the beam from the light source 1, the incident angle of the beams R1 and R2 at the points P1 and P2 can be set to be about 30°. The exit angle of the positive and negative first mode diffracted beams and the positive and negative first mode rediffracted beams can be set to be about 30°. Therefore, an encoder having a high resolution can be arranged without being restricted by the layout of the optical members.

In this rotary encoder, the beams R1 and R2 are diffracted at the symmetrical points P1 and P2 on the rotary disk 5. Therefore, high-precision rotation detection which can minimize an influence of eccentricity of the center (radial center) of the radial diffraction grating from the center 0 of rotation of the rotary disk 5 can be achieved.

Since the optical path of the positive and negative first mode diffracted beams transmitted from the prism 31 to the prism 32 are almost common to each other, an optical path difference is not increased by variations in ambient temperature. Therefore, very stable detection can be performed.

Figures 4A, 4B, 4C, 4D, 4E:
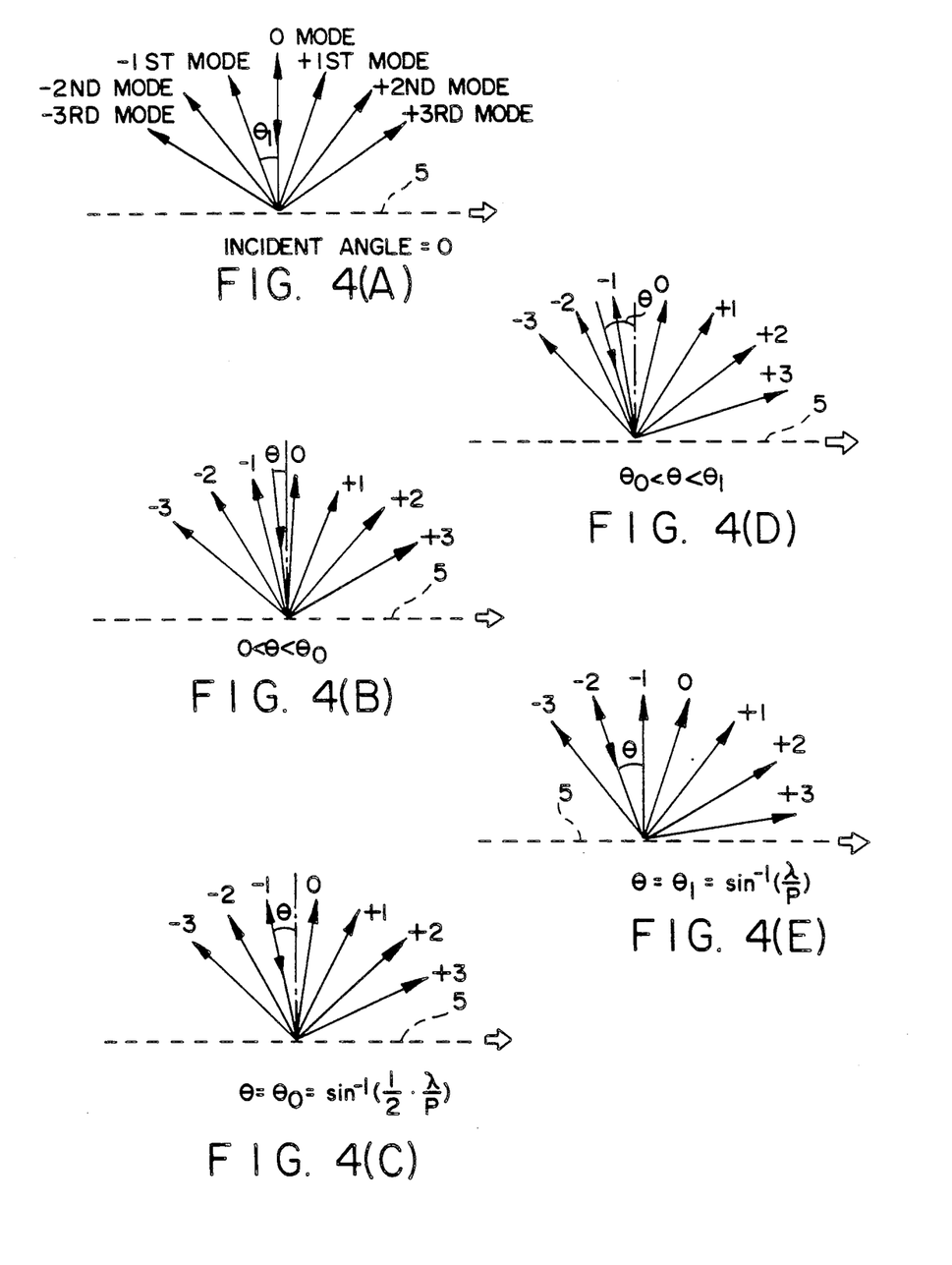

The mode of the diffracted beam in the above description is exemplified as the positive or negative first mode. However, as shown in FIG. 4, at different incident angles indicated by (A) to (E), a direction of movement of the diffraction grating 5 which coincides with a shift direction of beam propagation is defined as a positive direction, and the opposite direction is defined as a negative direction.

In the rotary encoder shown in FIG. 1, the polarizing beam splitter surfaces 41 and 42 of the prisms 31 and 32 are formed to originally transmit only a P-polarized beam and reflect only an S-polarized beam. In practice, however, it is not easy to form such perfect polarizing beam splitter surfaces. A beam transmitted from the polarizing beam splitter surface 41 of the prism 31 along the optical path L1 and incident on the point P1 on the diffraction grating, and a beam transmitted along the optical path L2 and incident on the point P1 on the diffraction grating contain both P- and S-polarized beam components. The positive and negative first mode diffracted beams (R1+) and (R2−) incident on the polarizing beam splitter surface 41 through the λ/4 plate 71 are an S-polarized beam containing a given amount of P-polarized beam and a P-polarized beam containing a given amount of S-polarized beam. The S-polarized beam of the positive first order diffracted beam (R1+) and the P-polarized beam of the negative first mode diffracted beam (R2−) are superposed on each other through the polarizing beam splitter surface 41 and emerge from the polarizing beam splitter surface 41. In this case, due to the imperfect operation of the polarizing beam splitter surface 41, as described above, the P-polarized beam (to be referred to as a positive first mode unnecessary diffracted beam) of the positive first mode diffracted beam (R1+) and an S-polarized beam (to be referred to as a negative first mode unnecessary diffracted beam) of the negative first mode diffracted beam (R2−) are also superposed on each other and emerge from the polarizing beam splitter surface 41.

The positive and negative first mode unnecessary diffracted beams pass through a prism 3 and are incident on the $\lambda/2$ plate 8. The positive first mode unnecessary diffracted beam is converted into an S-polarized beam through the $\lambda/2$ plate 8, while the negative first mode unnecessary diffracted beam is converted into a P-polarized beam through the $\lambda/2$ plate 8. When these positive and negative first mode unnecessary diffracted beams are incident on the polarizing beam splitter surface 42 of the prism 32, the positive first mode unnecessary diffracted beam is reflected and directed toward the optical path L4. The negative first mode unnecessary diffracted beam is directed toward the optical path L3. The positive first mode unnecessary diffracted beam propagates along the optical path L4 and is incident on the point P2 of the diffraction grating through the $\lambda/4$ plate 72. The negative first mode unnecessary diffracted beam propagates along the optical path L3 and is incident on the point P2 of the diffraction grating through the $\lambda/4$ plate 72. A negative first mode necessary rediffracted beam generated upon reflection and diffraction of the positive first mode unnecessary diffracted beam on the diffraction grating emerges toward the optical path L4. A positive first mode unnecessary rediffracted beam generated upon reflection and diffraction of the negative first mode unnecessary diffracted beam on the diffraction grating emerges toward the optical path L3. The negative first mode unnecessary rediffracted beam is transmitted through the $\lambda/4$ plate 72 along the optical path L4 and is directed toward the polarizing beam splitter surface 42. The positive first mode unnecessary rediffracted beam is transmitted through the $\lambda/4$ plate 72 along the optical path L3 and is directed toward the polarizing beam splitter surface 42. At this time, the negative first mode unnecessary rediffracted beam is converted into a P-polarized beam and the positive first mode unnecessary rediffracted beam is converted into an S-polarized beam by the $\lambda/4$ plate 72. The negative first mode unnecessary rediffracted beam is transmitted through the polarizing beam splitter surface 42, while the positive first mode unnecessary rediffracted beam is reflected thereby. The positive and negative first mode unnecessary rediffracted beams are superposed on each other and emerge from the polarizing beam splitter surface 42. Since the optical path of the positive and negative unnecessary rediffracted beams coincides with that of the positive and negative first mode rediffracted beams (R1++, and R2−−), they are directed together with the positive and negative first mode rediffracted beams toward the light-receiving elements S1 and S2.

Since the negative first mode unnecessary rediffracted beam is a negative first mode diffracted beam obtained by rediffracting the positive first mode diffracted beam from the point P1 on the point P2 of the diffraction grating, the phase is kept unchanged although the diffraction grating is displaced. On the other hand, the positive first mode unnecessary rediffracted beam is a positive first mode diffracted beam obtained by rediffracting the negative first mode diffracted beam from the point P1 on the point P2 of the diffraction grating. The phase is also kept unchanged even if the diffraction grating is displaced.

The negative first mode unnecessary rediffracted beam has the same polarization direction as that of the negative first mode rediffracted beam (R2−−), and the positive first mode unnecessary rediffracted beam has the same polarization direction as that of the positive first mode rediffracted beam (R1++). The negative first mode unnecessary rediffracted beam interferes with the negative first mode rediffracted beam (R2−−), and the positive first mode unnecessary rediffracted beam interferes with the positive first mode rediffracted beam (R1++). Signals from the light-receiving elements S1 and S2 are obtained such that sinusoidal wave signals corresponding to a fringe pattern of the interfered beams of the positive and negative first mode rediffracted beams (R1++ and R2−−) are modulated with sinusoidal wave signals corresponding to a fringe pattern of the positive and negative first mode rediffracted beams by the behaviors of the positive and negative first mode unnecessary diffracted beams. As described above, the sinusoidal wave signal based on the interference between the positive and negative first mode rediffracted beams (R1++ and R2−−) is generated by four periods upon a displacement of the diffraction grating by one pitch. On the other hand, the sinusoidal wave signal based on the behavior of the positive and negative first mode unnecessary diffracted beams is generated by two periods upon a displacement of the diffraction grating by one pitch.

The amplitudes and phases of the sinusoidal wave signals from the light-receiving elements S1 and S2 are modulated, and their wavelengths are disturbed. This disturbance causes degradation of precision for measuring a displacement of the diffraction grating. In particular, when the sinusoidal wave signals obtained from the light-receiving elements S1 and S2 are electrically divided to generate a large number of pulses (electrical division), the pulses cannot be generated.

The object of the present invention is to eliminate variations in amplitudes and phases of the sinusoidal wave signals from the light-receiving elements, and will be exemplified as follows.

Figure 2:
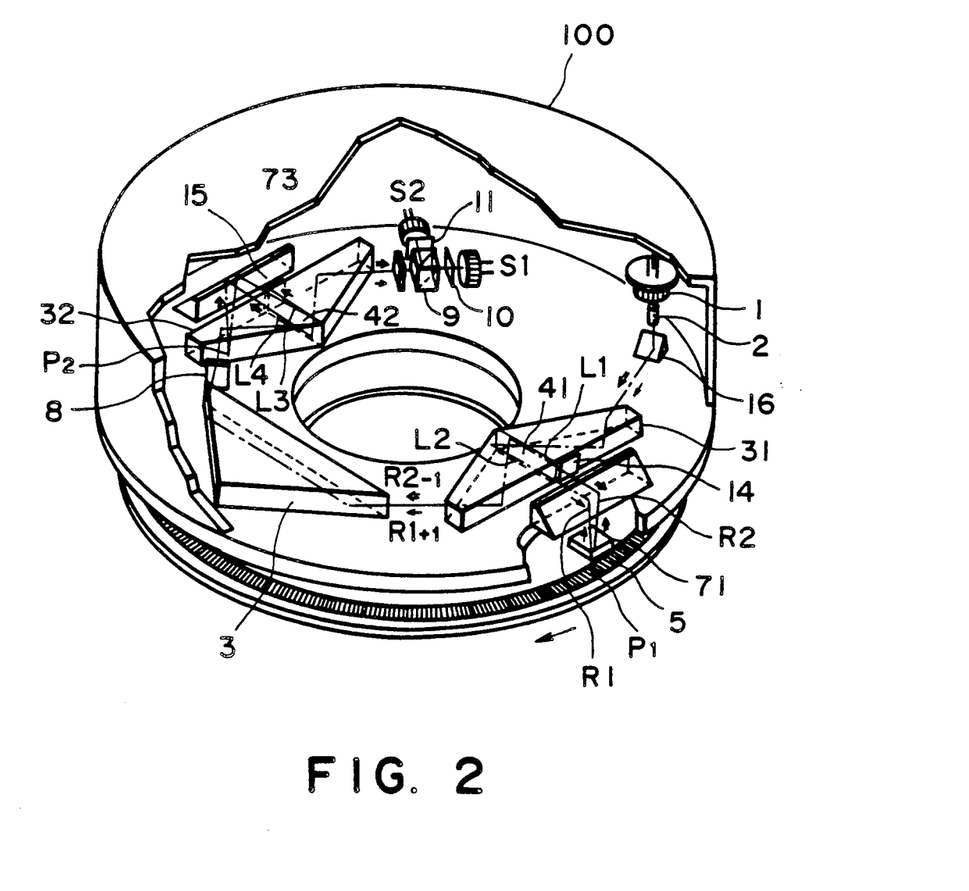
FIG. 2 is a perspective view of an embodiment of the present invention.

FIG. 2 is a perspective view showing an encoder according to an embodiment of the present invention. An encoder of this embodiment comprises a light source 1 consisting of a multimode semiconductor laser, a collimator lens 2, prisms 31 and 32, polarizing beam splitter surfaces 41 and 42, a rotary disk (diffraction grating) 5, $\lambda/4$ plates 71, 72, and 73, a $\lambda/2$ plate 8, a nonpolarizing beam splitter 9, analyzers 10 and 11, light-receiving elements S1 and S2, glass plates 14 and 15 having the same thickness, and a folding mirror 16. As is apparent from comparison between the arrangements in FIGS. 1 and 2, the encoder of this embodiment is substantially the same as that of FIG. 1, except that the glass plates 14 and 15 and the folding mirror 16 are additionally arranged in the embodiment of FIG. 2. Reference numeral 100 denotes a reading unit.

A beam emitted from the light source 1 is collimated by the collimator lens 2 and is incident on the prism 31.

This collimated beam is split into beams R1 and R2 by the polarizing beam splitter surface 41 through a mirror formed on the prism 31. The glass plate 14 gives a predetermined optical path length difference to the beam R2 from the beam R1. The beams R1 and R2 travel along optical paths L1 and L2, respectively. Lengths $|L1|$ and $|L2|$ of the optical paths L1 and L2 are defined as follows:

$$|L1| - |L2| = \Delta_{12} \neq 0$$

The beam R1 (P-polarized beam + a given amount of S-polarized beam) and the beam R2 (S-polarized beam + a given amount of P-polarized beam) pass through the λ/4 plate 71 and are simultaneously incident on a point P1 of the radial diffraction grating on the rotary disk 5 from opposite directions. As previously described, the beams R1 and R2 are diffracted at the point P1. An incident angle $\theta_0 [= \sin^{-1}(\lambda/2p)]$ of the beams is determined, as shown in the incident angle (C) of FIG. 4, so that, of a plurality of diffracted beams emerging from the point P1, a positive first mode reflected and diffracted beam ($R1_{+1}$) obtained by diffracting the beam R1 and a negative first mode reflected and diffracted beam ($R2_{-1}$) obtained by diffracting the beam R2 travel along the optical paths L1 and L2, respectively. The positive first mode reflected and diffracted beam ($R1_{+1}$) and the negative first mode reflected and diffracted beam ($R2_{-1}$) are given the following phase shifts during rotation of the radial diffraction grating of the disk by one pitch. That is, the phase of the wave front of the positive first mode reflected and diffracted beam ($R1_{+1}$) is advanced by $2\pi$, and that of the negative first mode reflected and diffracted beam ($R2_{-1}$) is delayed by $2\pi$.

Although the beams R1 and R2 are converted by the polarizing beam splitter surface 41 into linearly polarized beams whose polarization planes are almost perpendicular to each other, reciprocal propagation of the beams through the λ/4 plate 71 causes reversal of the polarization planes of the positive and negative reflected and diffracted beams ($R1_{+1}$ and $R2_{-2}$). Therefore, the positive first mode reflected and diffracted beam ($R1_{+1}$) becomes an "S-polarized beam + a given amount of P-polarized beam", and the negative first mode reflected and diffracted beam ($R2_{-1}$) becomes a "P-polarized beam + a given amount of S-polarized beam". The S-polarized beam component of the positive first mode reflected and diffracted beam ($R1_{+1}$) is reflected by the polarizing beam splitter surface 41 and emerges from the prism 31. The P-polarized beam component of the negative first mode reflected and diffracted beam ($R2_{-1}$) passes through the polarizing beam splitter surface 41, is superposed on the S-polarized component of the positive first mode reflected and diffracted beam ($R1_{+1}$), and emerges from the prism 31.

Due to imperfect characteristics of the polarizing beam splitter surface 41, a small amount of P-polarized component contained in the positive first mode reflected and diffracted beam ($R1_{+1}$) is partially reflected by the polarizing beam splitter surface 41, and a small amount of S-polarized component contained in the negative first mode reflected and diffracted beam ($R2_{-1}$) is partially transmitted through the polarizing beam splitter surface 41. The leaking components are superposed on each other and emerge from the prism 31.

The positive and negative first mode reflected and diffracted beams ($R1_{+1}$ and $R2_{-1}$) are kept superposed on each other and are transmitted to a prism 3. These beams are then reflected by the prism 3 and pass through the λ/2 plate 8 so that their polarization planes ar reversed. That is, the positive first mode reflected and diffracted beam ($R1_{+1}$) is converted into a "P-polarized beam + a given amount of S-polarized beam", and the negative first mode reflected and diffracted beam ($R2_{-1}$) is converted into an "S-polarized beam + a given amount of P-polarized beam". These diffracted beams ($R1_{+1}$ and $R2_{-1}$) are incident on the prism 32, and are incident on the polarizing beam splitter surface 42 through the mirror formed on the prism 32. The P-polarized beam component of each diffracted beam ($R1_{+1}$ or $R2_{-1}$) is guided along the optical path L3, and its S-polarized beam component is guided along the optical path L4. In this case, the glass plate 15 is arranged midway along the optical path L3 for the P-polarized component. Lengths $|L3|$ and $|L4|$ of the optical paths L3 and L4 are set to satisfy the following relations:

$$|L3| - |L4| = \Delta_{34} \neq 0$$

$$|L1| = |L3| = |L2| + |L4|$$

The values $\Delta_{34}$ and $\Delta_{12}$ described above are set so that a difference between optical paths of beams incident on the light-receiving elements S1 and S2 through the optical paths L1 and L3 are beams incident on the light-receiving elements S1 and S2 through the optical paths L2 and L3, and a difference between the optical paths of beams incident on the light-receiving elements S1 and S2 through the optical paths L2 and L4 and beams incident on the light-receiving elements S1 and S2 through the optical paths L1 and L4 are set to be larger than a coherent length of the beam from the light source 1. After the positive and negative first mode reflected and diffracted beams ($R1_{+1}$ and $R2_{-1}$) pass through the λ/4 plate 72, they are incident on the point P2. The points P1 and P2 are set at positions symmetrical about the center of rotation of the rotary disk 5.

Of a plurality of diffracted beams emerging from the point P2, the positive first mode reflected and rediffracted beams ($R1_{+1+1}$ and $R2_{-1+1}$) of the positive and negative first mode reflected and diffracted beams ($R1_{+1}$ and $R2_{-1}$) travel back along the optical path L3 while their phase is advanced by $2\pi$ during rotation of the radial diffracted grating of the rotary disk 5 by one pitch. The negative first mode reflected and rediffracted beams ($R2_{-1-1}$ and $R1_{+1-1}$) of the positive and negative reflected and diffracted beams ($R2_{-1}$ and $R1_{+1}$) traveling along the optical path L4 travel back along the optical path L4 while their phase is delayed by $2\pi$. That is, the phase shifts of the wave fronts of the beams upon rotation of the radial diffracted grating of the rotary disk 5 by one pitch are as follows:

$$R1_{+1+1} \ldots + 2\pi + 2\pi = +4\pi$$

$$R2_{-1-1} \ldots - 2\pi - 2\pi = -4\pi$$

$R1_{+1-1}$ (unnecessary rediffracted beam)
$$\ldots + 2\pi - 2\pi = 0$$

$R2_{-1+1}$ (unnecessary rediffracted beam)
$$\ldots - 2\pi + 2\pi = 0$$

Each reflected and rediffracted beam passes through the λ/4 plate 72 again, and the positive first mode reflected and diffracted beams ($R1_{+1+1}$ and $R2_{-1+1}$)

become S-polarized beams, and the negative first mode reflected and rediffracted beams ($R2_{-1-1}$ and $R1_{+1-1}$) become P-polarized beams. The S- and P-polarized beams are incident on the prism 32. The S-polarized beams ($R1_{+1+1}$ and $R2_{-1+1}$) are reflected by the polarizing beam splitter surface 42 in the prism 32, and the P-polarized beams ($R2_{-1-1}$ and $R1_{+1-1}$) are transmitted therethrough. The four beams are superposed on each other and emerge from the prism 32. Of these beams, the polarization planes of the two beams ($R1_{+1+1}$ and $R2_{-1+1}$) coincide with each other. The optical path lengths of these beams are given as follows:

$R1_{+1+1} \ldots |L1| \times 2 + |L3| \times 2 + L_0$ $R2_{-1+1} \ldots |L2| \times 2 + |L3| \times 2 + L_0$ ($L_0$ is the common optical path length)

A difference $\Delta l$ ($\Delta l = \Delta_{12} \times 2 \neq 0$) of the optical paths is given. The values $\Delta_{12}$ and $\Delta_{34}$ are given so that the difference $\Delta l$ is larger than the coherent length of the beam from the light source 1. Therefore, the two beams ($R1_{+1+1}$ and $R2_{-1+1}$) do not interfere with each other, and the intensity of the beam ($R_{+1+1}$) is not modulated. That is, the beam ($R2_{-1+1}$) becomes a simple DC component. The polarization planes of the two beams ($R2_{-1-1}$ and $R1_{+1-1}$) coincide with each other. A difference between these optical path lengths is given as $\Delta l = \Delta_{34} \times 2$ due to the same reason described above. The intensity of the beam ($R_{-1-1}$) is not modulated. The S-polarized beams ($R1_{+1+1}$ and $R2_{-1+1}$) and the P-polarized beams ($R2_{-1-1}$ and $R1_{+1-1}$) pass through the $\lambda/4$ plate 73 and are converted into circularly polarized beams whose polarization planes are rotated in opposite directions. Therefore, a polarization state of the composite beam is given as a linearly polarized beam. The polarization direction of this linearly polarized beam is determined by a phase difference between the beams ($R1_{+1+1}$ and $R2_{-1-1}$) and is changed in an order of 45°, 67.5°, 90°, 112.5°, 135°, 157.5°, ..., and 225° (45°) in accordance with changes in phase differences of 0, $\pi/4$, $2\pi/4$, $3\pi/4$, $4\pi/4$, $5\pi/4$, ..., and $8\pi/4$. This linearly polarized beam is split into two beams having the same intensity by the nonpolarizing beam splitter 9. A specific polarized component of one split beam is extracted by the analyzer 10 and is incident as an interfered beam on the light-receiving element S1. A specific polarized component of the other split beam is extracted and incident as an interfered beam on the light-receiving element S2. Periodic sinusoidal wave signals are output from the light-receiving elements S1 and S2. When the polarized components extracted by the analyzers 10 and 11 have a phase difference of −45°, the fringe pattern timings of the interfered beams are shifted by ¼ period (i.e., $\pi/2$ in the phase of the sinusoidal wave signal). The resultant two-phase sinusoidal wave signal is electrically amplified and binarized to obtain signals respectively corresponding to the rotational angle and direction. In this case, a small amount of the DC component is added to the sinusoidal signal components from the light-receiving elements S1 and S2 by the influence of the beams ($R1_{+1-1}$ and $R2_{-1+1}$) However, this DC component does not cause changes in amplitude and phase of the sinusoidal wave signal, and a signal having a correct waveform can be obtained. Electrical division of the sinusoidal wave signal by a subsequent circuit can also be accurately performed.

Referring to FIG. 2, if the incident angles (indicated by B and D in FIG. 4) of the beams incident on the points P1 and P2 are slightly changed so that the forward optical path does not coincide with the backward optical path, a regularly reflected beam of each beam is not mixed in another optical path, resulting in convenience. With this arrangement, the length of a backward path L1′ corresponding to the optical path L1 is given as $|L1'|$, the length of a backward path L2′ corresponding to the optical path L2, is given as $|L2'|$, the length of a backward path L3′ corresponding to the optical path L3 is given as $|L3'|$, and the length of a backward path L4′ corresponding to the optical path L4 is given as $|L4'|$. Under these conditions, these optical path lengths are set to satisfy the following conditions by inserting a glass plate as in FIG. 2.

$|L1| + |L1'| + |L3''| + |L3| =$ $|L2| + |L2'| + |L4''| + |L4|$

In the encoder of the embodiment described above, a multimode semiconductor laser is used as the light source 1, and the glass plate is simply inserted into the optical path so that only the interference action of the unnecessary diffracted beam is eliminated, and interference between the necessary positive and negative first mode rediffracted beams is not prevented. The light source may be a normal single-mode semiconductor laser or a gas laser such as an Ar+ or HeNe gas laser. When the glass plate 14 is inserted into the optical path L1′ the glass plate 15 is inserted into the optical path L4. However, when the glass plate 14 is inserted into the optical path L2, the glass plate 15 is inserted into the optical path L3. In addition, the above embodiment exemplifies an arrangement for measuring a displacement of the diffraction grating of the rotary disk (scale). However, the present invention is also applicable to a linear encoder for measuring a displacement of a diffraction grating formed in a linear scale.

Figure 3:
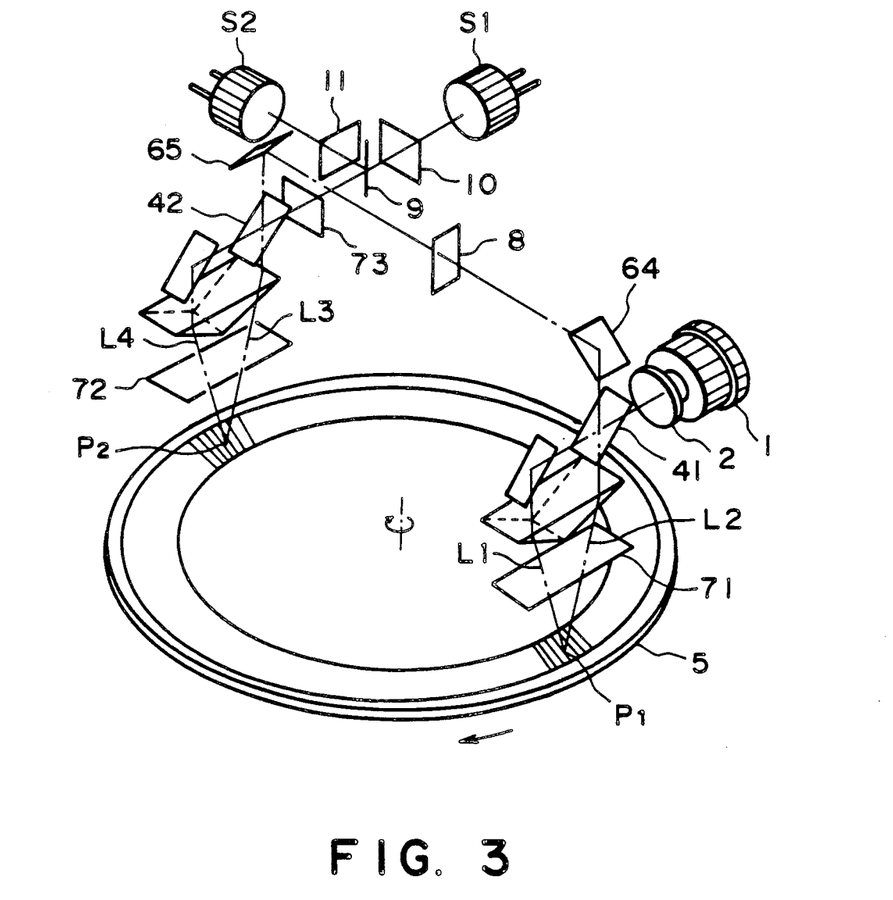
FIG. 3 is a perspective view showing a modification of the encoder shown in FIG. 2.

FIG. 3 is a schematic view showing a modification of the embodiment shown in FIG. 2. The difference between the optical paths L1 and L2 is differentiated from that between the optical paths L3 and L4 by the shapes and layout of the optical members without using the glass plates 14 and 15. The same reference numerals as in FIGS. 1 and 2 denote the same parts in FIG. 3. The functions of the encoder shown in FIG. 3 are the same as those in FIG. 2, and a detailed description thereof will be omitted.

Figure 5:
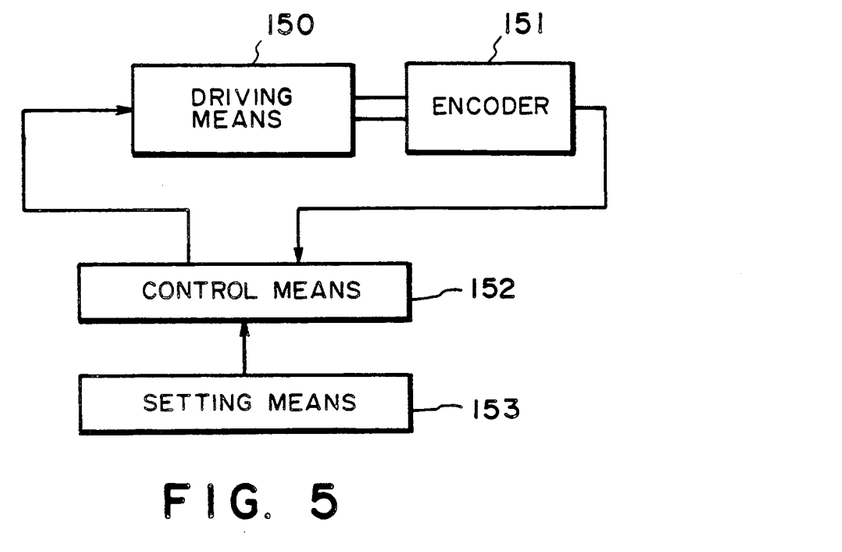
FIG. 5 is a block diagram of a drive system having an encoder.

According to the present invention, as has been described above, although the characteristics of the optical components such as a polarizing beam splitter and a wavelength plate are slightly degraded, and an unnecessary diffracted beam is formed in an optical path, an output signal from the encoder is not adversely affected. Relatively inexpensive optical components can be used, and a higher resolution can be obtained by electrical signal division FIG. 5 is a block diagram of a drive system having the rotary encoder described above. An encoder 151 as described above is connected to a rotation output section of a drive means 150 having a drive source such as a motor, an actuator, or an internal combustion engine. The encoder 151 detects a drive state such as a rotation amount or speed. A detection output from the encoder 151 is fed back to a control means 152. The control means 152 transmits a drive signal to the drive means 150 so that a state set by a setting means 153 is obtained. Since a feedback system is arranged as described above, a rotational state set by the setting means 153 can be obtained. Such a drive system can be used in a variety of applications in various machine tools, manufacturing machines, measuring equipments, robots, cameras, audio equipments, information equipments, and other devices having a drive means.

Figure 6:
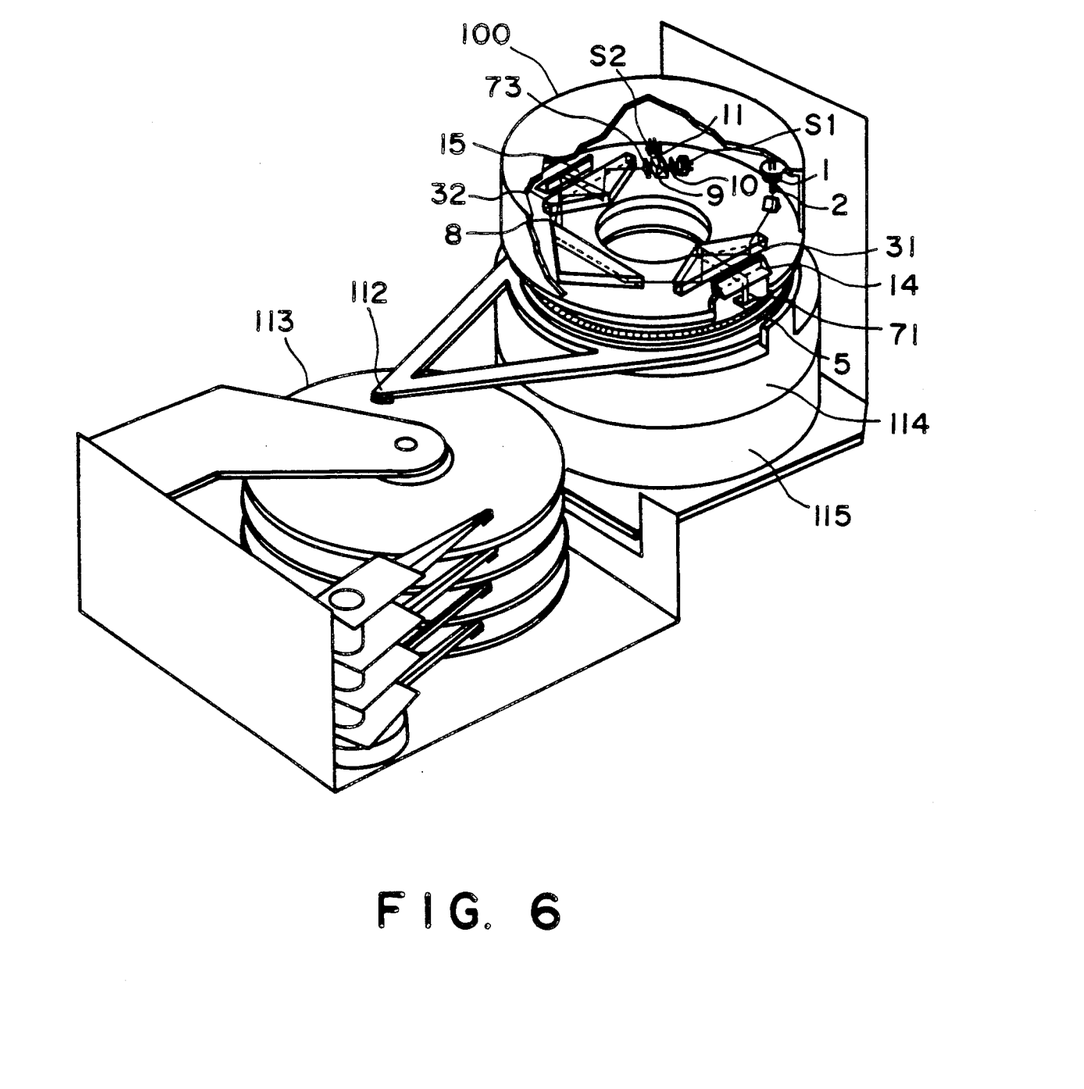
FIG. 6 is a view showing an arrangement wherein an encoder of the present invention is applied to a magnetic disk track signal write unit.

FIG. 6 shows an application of the above drive system, i.e., a track signal write unit for a magnetic disk. A rotary encoder 100 having the above arrangement is mounted on a rotary stage 114 having an air bearing to detect a rotational angle of the rotary stage 114. The rotary stage 114 is driven by a drive stepping motor 115. A signal write head 112 is mounted at the distal end mounted on the rotary stage 114, so that a track signal can be written in a magnetic disk 113. A detection signal from the encoder 100 is fed back to a control circuit (not shown), and the stepping motor 115 is driven so that the write head 112 is moved to a position set by a setting means (not shown).

What is claimed is:

1. An encoder comprising:
    a light source;
    a first polarizing beam splitter for splitting a beam from said light source into beams R1 and R2;
    a λ/4 plate arranged in an optical path L1 for the beam R1 and an optical path L2 for the beam R2;
    first optical means for causing the beams R1 and R2 to be incident at a first position of a diffraction grating so that a positive first mode diffracted beam obtained by diffracting the beam R1 at the first position of said diffraction grating is guided along the optical path L1 and a negative second mode diffracted beam obtained by diffracting the beam R2 at the first position of said diffraction grating is guided along the optical path L2, and for superposing the positive first mode diffracted beam and the negative second mode diffracted beam on each other through said first polarizing beam splitter;
    a second polarizing beam splitter for splitting the positive first mode diffracted beam and the negative second mode diffracted beam from said first optical means from each other;
    a second λ/4 plate arranged in an optical path L3 for the positive first mode diffracted beam from said second polarizing beam splitter and an optical path L4 for the negative second mode diffracted beam from said second polarizing beam splitter;
    second optical means for causing the positive first mode diffracted beam and the negative second mode diffracted beam to be incident at a second position of said diffraction grating so that a positive first mode rediffracted beam obtained by diffracting the positive first mode diffracted beam at the second position of said diffraction grating is guided along the optical path L3 and a negative second mode rediffracted beam obtained by diffracting the negative second mode diffracted beam at the second position of said diffraction grating is guided along the optical path L4, and for superposing the positive first mode rediffracted beam and the negative second mode rediffracted beam on each other through said second polarizing beam splitter; and
    photoelectric converting means for causing the positive first mode rediffracted beam and the negative second mode rediffracted beam from said second optical means to interfere with each other to form an interference beam and for converting the inference beam into an electrical signal,
    wherein a difference between optical path lengths of beams incident on said converting means through the optical paths L1 and L4 and of beams incident on said converting means through the optical paths L2 and L4, and a difference between optical path lengths of beams incident on said converting means through the optical paths L1 and L3 and of beams incident on said converting means through the optical paths L2 and L3 are set to be larger than a coherent length of the beam from said light source.

2. An encoder according to claim 1, wherein said encoder comprises a rotary encoder, and said diffraction grating is formed along a rotational direction of a rotary scale.

3. An encoder according to claim 2, wherein the first and second positions on said diffraction grating are substantially symmetrical about a center of rotation of said rotary scale.

4. An encoder according to claim 1, wherein the optical path lengths are set by a medium having a refractive index different from that of air and located in an optical path.

5. An encoder according to claim 4, wherein said medium is a glass plate.

6. An encoder according to claim 1, wherein said light source comprises a semiconductor laser.

7. An encoder according to claim 6, wherein said semiconductor comprises a multimode semiconductor laser.

8. An encoder according to claim 1, wherein said photoelectric converting means comprises at least two light-receiving elements for detecting signals having different phases.

9. An encoder according to claim 1, wherein said first and second optical means cause the beams to be incident on said diffraction grating at an incident angle $\theta_0 = \sin^{-1}(\lambda/2P)$ where $\lambda$ is a wavelength of the beam and P is a grating pitch of said diffraction grating.

10. A drive system having an encoder, comprising:
    driving means having a drive source; and
    an encoder for detecting a drive state of said driving means, said encoder being provided with
    light source,
    a diffraction grating formed in a drive output section of said driving means,
    a first polarizing beam splitter for splitting a beam from said light source into beams R1 and R2,
    a λ/4 plate arranged in an optical path L1 for the beam R1 and an optical path L2 for the beam R2,
    first optical means for causing the beams R1 and R2 to be incident at a first position of said diffraction grating so that a positive first mode diffracted beam obtained by diffracting the beam R1 at the first position of said diffraction grating is guided along the optical path L1 and a negative second mode diffracted beam obtained by diffracting the beam R2 at the first position of said diffraction grating is guided along the optical path L2, and for superposing the positive first mode diffracted beam and the negative second mode diffracted beam on each other through said first polarizing beam splitter,
    a second polarizing beam splitter for splitting the positive first mode diffracted beam and the negative second mode diffracted beam from said first optical means from each other, a second λ/4 plate arranged in an optical path L3 for the positive first mode diffracted beam from said second polarizing beam splitter and an optical path L4 for the negative second mode diffracted beam from said second polarizing beam splitter, second optical means for causing the positive first mode diffracted beam and the negative second mode diffracted beam to be incident at a second position of said diffraction grating so that a positive first mode diffracted beam obtained by diffracting the positive first mode diffracted beam at the second position of said diffraction grating is guided along the optical path L3 and a negative second mode rediffracted beam obtained by diffracting the negative second mode diffracted beam at the second position of said diffraction grating is guided along the optical path L4, and for superposing the positive first mode rediffracted beam and the negative second mode rediffracted beam on each other through said second polarizing beam splitter, and photoelectric converting means for causing the positive first mode rediffracted beam and the negative second mode rediffracted beam from said second optical means to interfere with each other to form an interference beam and for converting the interference beam into an electrical signal, and for obtaining a signal representing the drive state, wherein a difference between optical path lengths of beams incident on said converting means through the optical paths L1 and L4 and of beams incident on said converting means through the optical paths L2 and L4, and a difference between optical path lengths of beams incident on said converting means through the optical paths L1 and L3 and of beams incident on said converting means through the optical paths L2 and L3 are set to be larger than a coherent length of a beam from said light source.

11. A system according to claim 10, further comprising:

setting means for setting the drive state of said driving means; and control means for controlling said driving means on the basis of an output from said encoder so as to obtain a state set by said setting means.

* * * * *

UNITED STATES PATENT AND TRADEMARK OFFICE
CERTIFICATE OF CORRECTION

PATENT NO. : 5,126,562  
DATED : June 30, 1992  
INVENTOR(S) : KOH ISHIZUKA, ET AL.

Page 1 of 2

It is certified that error appears in the above-identified patent and that said Letters Patent is hereby corrected as shown below:

ON THE TITLE PAGE:
[56] References Cited

"Nishiumura" should read --Nishimura--.

COLUMN 3

Line 63, "(R1- -)" should read --(R1--)--.

COLUMN 5

Line 34, "necessary" should read --unnecessary--.

COLUMN 7

Line 41, "R2-$_2$)." should read --R2-$_1$).--.

COLUMN 8

Line 3, "ar" should read --are--.

Line 23, "|L1|=|L3|=|L2|+|L4|" should read --|L1|+|L3|=|L2|+|L4|--.

COLUMN 9

Line 54, "—45°," should read -- 45°,--.

UNITED STATES PATENT AND TRADEMARK OFFICE
CERTIFICATE OF CORRECTION

PATENT NO. : 5,126,562
DATED : June 30, 1992
INVENTOR(S) : KOH ISHIZUKA, ET AL.

It is certified that error appears in the above-identified patent and that said Letters Patent is hereby corrected as shown below:

COLUMN 12

Line 1, "infer" should read --interfer--.

Line 45, "with" should read --with:--.

Signed and Sealed this

Thirty-first Day of August, 1993

Attest:

BRUCE LEHMAN

Attesting Officer

Commissioner of Patents and Trademarks